OSCILLATOR CIRCUIT
Filed Sept. 27, 1968
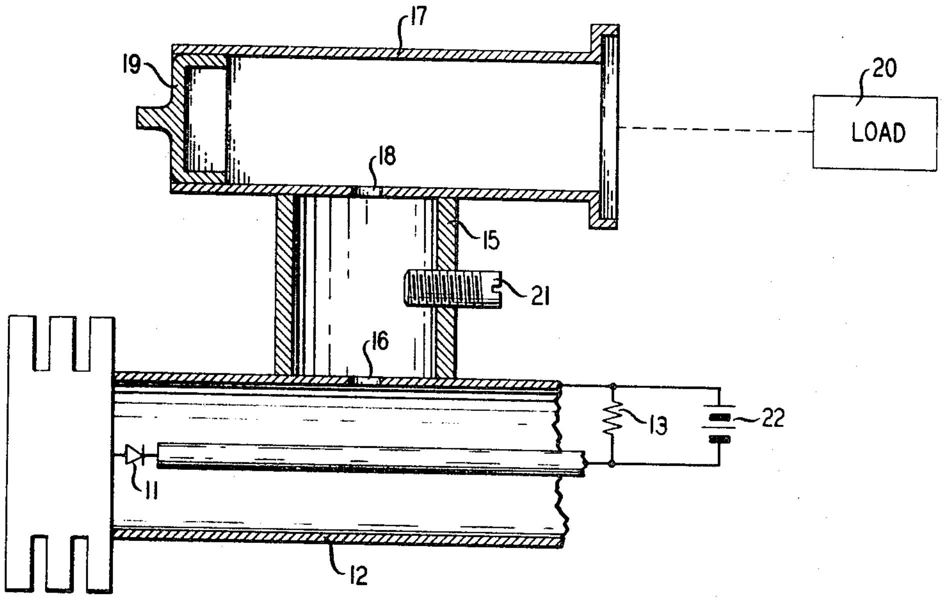
INVENTOR
E. T. HARKLESS
BY
Roderick B. Anderson
ATTORNEY United States Patent Office 3,534,293

Patented Oct. 13, 1970

3,534,293

OSCILLATOR CIRCUIT

Earl T. Harkless, Fair Haven, N.J., assignor to Bell Telephone Laboratories, Incorporated, Murray Hill, N.J., a corporation of New York Filed Sept. 27, 1968, Ser. No. 763,138
Int. Cl. H03b *7/14*
U.S. Cl. 331—107 6 Claims

ABSTRACT OF THE DISCLOSURE

A microwave oscillator circuit comprises a transmission line coaxial cable having a negative resistance diode mounted at one end and a dissipative impedance connected across the other end. A resonator is coupled at one end to a mid-portion of the transmission line and at the other end to a waveguide that transmits output energy to a load. The resonator is appropriately located with respect to the diode to feed back energy to the diode to maintain oscillation at the desired frequency while permitting undesired frequency components to be transmitted by the transmission line to the dissipative impedance.

BACKGROUND OF THE INVENTION

This invention relates to oscillator circuits, and more particularly, to oscillator circuits using negative resistance devices.

A negative resistance oscillator basically comprises a negative resistance device connected through a resonator tuned to the desired frequency to a load having a positive resistance "seen" by the device that is equal in magnitude to the negative resistance of the device. Typical examples of negative resistance devices used for generating microwave oscillations are the IMPATT diode, Gunn-effect diode, tunnel diode and LSA diode. With the possible exception of the Gunn-effect diode, these devices all require that energy be fed back to the diode terminals in synchronism with current through the diode to maintain continuous oscillation generation. Unfortunately, even when design precautions are taken, frequencies other than the desired frequency may be applied across the diode, causing frequency instability; that is, the appropriate conditions for oscillation may occur at frequencies radically different from the desired frequency. This susceptibility to frequency instability appears to be particularly true of IMPATT diodes, although it is also true of other negative resistance devices, and even self-contained oscillator devices such as the magnetron.

SUMMARY OF THE INVENTION

In accordance with the invention, a negative resistance device is located at one end of a first transmission line with the other end of the transmission line being terminated in a matched reflectionless dissipative impedance. A resonator tuned to the desired oscillation frequency is coupled to the first transmission line at a location appropriate for reflecting back energy to the diode to maintain oscillations, and also to a second transmission line that transmits output energy to a load.

While the resonator reflects part of the energy of the desired frequency back to the diode and directs part of it to the second transmission line, it does not affect energy at the other frequencies which is transmitted by the first transmission line to the dissipative impedance. Thus, in addition to constituting the external resonator of a negative resistance oscillator, the resonator also acts as a frequency selective signal splitter to prevent undesired frequencies from being transmitted to the load or reflected toward the negative resistance device, thereby reducing or eliminating the build-up of oscillations at undesired frequencies.

While the invention was stimulated by the problem of frequency instalibities in IMPATT diodes, it has potential utility in conjunction with virtually any kind of oscillator. Even if the oscillator at the end of the first transmission line is self-contained and the resonator is not part of the oscillator, it still promotes frequency stability by directing only energy at the desired frequency to the load.

These and other objects, features and advantages will be understood from a consideration of the following detailed description taken in conjunction with the accompanying drawing which is a schematic illustration of a negative resistance oscillator circuit in accordance with the invention.

DETAILED DESCRIPTION

Referring now to the drawing there is shown an oscillator comprising a negative resistance diode 11 connected to one end of a coaxial cable 12, the other end of the cable being terminated by a dissipative impedance 13. A resonant cavity 15 is coupled to the coaxial cable by a coupling slot 16 and to a waveguide 17 by a coupling slot 18. The waveguide is connected at one end to a load 20 and has a sliding short circuit tuning plunger 19 at its other end.

A tuning screw 21 is used in a known manner to adjust the resonant frequency of resonator 15 to the frequency $f$ desired for transmission to the load 20. The tuning plunger 19 is used to match the impedance of the load to that of the diode 11; that is, to make the magnitude of the positive resistance of the load as seen by the diode substantially equal to the negative resistance of the diode. The coupling slot 16 is designed and located in a known manner such as to reflect part of the energy from the diode at the desired frequency $f$ back to the diode, while directing part of it into the resonator and then to waveguide 17 for transmission to the load.

Only energy within the bandwidth of the resonator is reflected by the resonator or transmitted through the resonator to the load. Energy at other frequencies is transmitted along the coaxial cable 12 to be dissipated by the dissipative impedance 13. Hence, in addition to constituting the external resonator for the negative resistance oscillator, the resonator 15 also constitutes a frequency selective signal splitter for directing the desired oscillations at frequency $f$ to the load and the remaining oscillations to the dissipative impedance.

Diode 11 is preferably an IMPATT diode which is a semiconductor device having a p-n junction and a current transit region included between opposite contacts. An applied direct current voltage biases the junction to avalanche breakdown, thereby creating current pulses, each of which travels across the transit region within a prescribed time period. The transit time of the diode is arranged with respect to the resonant frequency of the external resonator such that radio-frequency voltages at the diode terminals are 180 degrees out-of-phase with the current pulses in the diode. Consequently, at appropriately applied frequencies, the current through the terminals increases as the terminal voltages decreases, thus meeting the conditions for negative resistance. In the circuit shown, the diode is biased by a D.-C. source 22 that supplies D.-C. current, part of which is ultimately converted by the diode to radio-frequency energy.

The precise location of slot 16 required to reflect oscillations of frequency $f$ to the diode for applying the appropriate R-F voltages for IMPATT operation is dependent on the circuit and diode parameters, and any description of the actual spacing would be meaningless in the absence of a complete specification of the circuit and diode, including the configurations of slots 16 and 18. In models made thus far, coupling slot 18 was designed to reflect back to the diode about 90 percent of the incident R-F power, as is convenient for IMPATT diode operation, while slot 16 was designed to control resonator noise and bandwidth. A detailed discussion of these and other parameters would require an extensive mesh circuit analysis which, since it involves only known design procedures would not for present purposes be justified.

If a self-contained oscillator such as a magnetron were used in place of diode 11, the cavity resonator 15 would not be required for maintaining oscillations but would perform only the function of a frequency selective signal splitter. This being the case, it would not be necessary to design coupling slot 18 to reflect energy at frequency *f* back toward the oscillator device; rather it would be designed to transmit all or nearly all of the desired frequency oscillations to the waveguide 17. In any case, the dissipative impedance 13 should be designed to match the coaxial cable impedance at all frequencies which the oscillator is capable of generating in order that none of the undesired frequencies be reflected. For this purpose, a coaxial cable is the preferred high frequency transmission line because it can easily be terminated with a broadband reflectionless load. The coaxial cable 12 may conveniently have a characteristic impedance of 50 ohms with dissipative impedance 13 also being 50 ohms to give reflectionless dissipation over virtually all frequencies.

The foregoing description is intended to be merely illustrative, and various other embodiments and modifications may be made without departing from the spirit and scope of the invention.

What is claimed is:

1. An oscillator circuit comprising:
a first transmission line;
means for generating oscillations at a frequency *f* comprising a negative resistance device mounted at one end of the first transmission line;
a matched dissipative impedance connected to the other end of the first transmission line;
a resonator having a resonant frequency *f* coupled to the first transmission line between the device and the dissipative impedance;
means for propagating oscillatory energy to a load comprising a second transmission line coupled to the resonator;
and means comprising the resonator for selectively channeling, from the nagtive resistance device to the second transmission line, oscillatory energy of frequency *f* while permitting energy of other frequencies to be transmitted to the dissipative impedance.

2. The oscillator circuit of claim 1 wherein:
the negative resistance device is an oscillator of the type requiring an external resonator for maintaining oscillation generation;
means for coupling the resonator to the first transmission line;
and means comprising said coupling means for deflecting back to the negative resistance device sufficient oscillatory energy at frequency *f* to maintain said oscillation generation.

3. The oscillator of claim 2 wherein:
the negative resistance device has an internal negative resistance at frequency *f*;
the load is connected to a terminal end of the second transmission line;
and the load has an apparent resistance at the location of the negative resistance device at frequency *f* which is substantially equal in magnitude to said negative resistance.

4. The oscillator circuit of claim 3 wherein:
the dissipative impedance has an impedance substantially equal to the characteristic impedance of the first transmission line, whereby substantially no energy is reflected by the dissipative impedance.

5. The oscillator circuit of claim 4 wherein:
the first transmission line is a coaxial cable, the resonator is a cavity resonator coupled to the coaxial cable by a coupling slot, and the negative resistance device is an IMPATT diode.

6. The oscillator of claim 5 wherein:
the second transmission line is a waveguide;
and further comprising means for impedance matching the load to the IMPATT diode comprising a tuning plunger in another terminal end of the second transmission line.

References Cited

UNITED STATES PATENTS 3,246,256 4/1966 Sommers ........... 331—107

JOHN KOMINSKI, Primary Examiner

U.S. Cl. X.R.

331—96, 101; 333—73, 83